US005193256A

United States Patent [19]

Ochiai et al.

[11] Patent Number: 5,193,256

[45] Date of Patent: Mar. 16, 1993

[54] METHOD OF FABRICATING INK-JET TYPE PRINTER HEAD

[75] Inventors: Kuniaki Ochiai, Mishima; Tsutomu Satoh, Tagata, both of Japan

[73] Assignee: Tokyo Electric Co., Ltd., Tokyo, Japan

[21] Appl. No.: 907,589

[22] Filed: Jul. 2, 1992

[30] Foreign Application Priority Data

Jul. 8, 1991 [JP] Japan .................................. 3-166631
Oct. 2, 1991 [JP] Japan .................................. 3-255565

[51] Int. Cl.[5] .............................................. H01L 41/22

[52] U.S. Cl. ...................................... 29/25.35; 29/416; 29/890.1; 346/140 R; 310/333

[58] Field of Search ..................... 29/25.35, 890.1, 416; 346/140 R; 310/330-333

[56] References Cited

U.S. PATENT DOCUMENTS 5,003,679 4/1991 Bartky et al. ....................... 29/25.35
5,072,240 12/1991 Miyazawa et al. ............ 29/25.35 X

FOREIGN PATENT DOCUMENTS 0364136 4/1990 European Pat. Off. .

*Primary Examiner*—Carl E. Hall
*Attorney, Agent, or Firm*—Oblon, Spivak, McClelland, Maier & Neustadt

[57] ABSTRACT

A method of producing an ink-jet type printer head wherein a plurality of plate-shaped piezoelectric members are stuck onto the surface of a low-rigidity member so that they are disposed adjacent to the low-rigidity member. A plurality of grooves extending from the surfaces of the piezoelectric members to the inside of the low-rigidity member are defined by grinding in parallel at given intervals inclusive of positions at which the grooves extend through joints between the adjacent piezoelectric members. In addition, posts are formed on both sides of each of the grooves and electrodes are disposed on both inner sides of each groove. A roof is stuck on the surfaces of the piezoelectric members so as to define a plurality of pressure chambers having one end in which a plurality of nozzles are formed.

3 Claims, 5 Drawing Sheets

METHOD OF FABRICATING INK-JET TYPE PRINTER HEAD

FIELD OF THE INVENTION AND RELATED ART STATEMENT

The present invention relates to a method of producing an ink-jet type printer head of an on-demand type.

An ink-jet type printer head disclosed in Japanese Patent Application Laid-Open No. Hei 2-150355 will first be described with reference to FIG. 7. More specifically, a piezoelectric member 30 has a plurality of pressure chambers 31 coupled to an ink supply unit, which are respectively partitioned by side walls 32. A plurality of nozzles 33 are defined in one end of each pressure chamber 31, respectively. A roof 34 is stuck on the piezoelectric member 30 to close the pressure chambers 31. Further, a pair of opposed electrodes 35, 36 are formed onto both side faces of each of the side walls 32. The piezoelectric member 30 is polarized in its thickness direction, i.e., in the direction indicated by the arrow $\gamma$. Thus, when a desired voltage is applied between the electrodes 35 and 36, the side wall 32 of the piezoelectric member 30 is deformed in the direction perpendicular to the polarized direction referred to above. The direction in which the side wall 32 is deformed is reversed depending on the polarity of the applied voltage. Accordingly, the capacity of the pressure chamber 31 partitioned by the side walls 32 is increased or decreased depending upon the polarity of the voltage applied between the electrodes 35 and 36. When the capacity of the pressure chamber 31 increases, the pressure in the pressure chamber 31 is reduced to thereby suck ink from the ink supply unit. When, on the other hand, the capacity of the pressure chamber 31 is decreased, the pressure in the pressure chamber 31 is increased to thereby deliver the internally-supplied ink from the nozzle 33.

When the ink-jet type printer head for a line printer is manufactured using such a principle, it is necessary to set the width of the ink-jet type printer head to 210 mm or longer when its width is associated with the paper size of A4, for example. It is, however, difficult to fabricate the piezoelectric member in a long size of 210 mm or longer and in thin form. Even if the piezoelectric member is produced in this condition, it becomes expensive. Therefore, a subdivided head block 37 is formed as shown in FIGS. 8 and 9. Then, an ink-jet type printer head 38 suitable to a line printer is formed by coupling a plurality of subdivided head blocks 37 to one another so that they are disposed adjacent to one another as shown in FIG. 10.

FIG. 11 shows the structure of each of the head blocks 37. Reference numeral 30 indicates a piezoelectric member which has a plurality of grooves 39 defined therein. The respective grooves 39 have electrodes (not shown) disposed on the inner surfaces thereof. The roof 34 for covering the grooves 39 is stuck on the piezoelectric member 30, and a nozzle plate 40 having a plurality of nozzles 33 defined therethrough in an opposing relationship to the leading ends of the grooves 39 is stuck on the end face of the piezoelectric member 30, thereby forming a head block 37.

The head blocks 37 should be coupled to one another in plural form to form the ink-jet type printer head 38 shown in each of FIGS. 8 through 11. Therefore, joints between the adjacent head blocks 37 look awkward. It is also difficult to stick or couple the head blocks 37 to one another because the area of a face 41 for sticking or bonding the head blocks 37 to one another is small. Further, since the pitch of each of the grooves 39 to be arranged is small and a side wall 42 between the adjacent grooves 39 is narrow in width, the centers of the side walls 42 cannot be regarded as the junction between the piezoelectric members 30 disposed adjacent to one another, and the grooves 39 are also defined on the face 41 for sticking the piezoelectric members 30 to each other. Therefore, a process for preventing the ink from leaking out of the bottom of each groove 39 should also be carried out. Accordingly, the manufacturing cost of the printer head is raised.

OBJECTS AND SUMMARY OF THE INVENTION

It is a first object of the present invention to provide an ink-jet type printer head which can be increased in width by using an inexpensive and narrow piezoelectric member.

It is a second object of the present invention to provide an ink-jet type printer head which can be reduced in cost by using a thin piezoelectric member.

It is a third object of the present invention to provide an ink-jet type printer head capable of reliably preventing ink from leaking out of a pressure chamber.

It is a fourth object of the present invention to provide an ink-jet type printer head capable of increasing the amount of strain of each of posts so as to improve the property of delivery of ink drops.

According to one aspect of the present invention, there is provided a method of fabricating an ink-jet type printer head, comprising the steps of sticking a plurality of plate-shaped piezoelectric members polarized in their thickness directions on the surface of a low-rigidity member having a non-conductive property and a non-electrostrictive property so that the piezoelectric members are disposed adjacent to the low-rigidity member; defining a plurality of grooves extending from the surfaces of the piezoelectric members to the inside of the low-rigidity member by grinding in parallel at given intervals inclusive of positions at which the grooves extend through respective joints between the adjacent piezoelectric members; forming posts on both sides of each of the grooves; forming electrodes on two inner sides of each of the grooves; sticking a roof on the surfaces of the piezoelectric members so as to close top opening surfaces of the grooves, thereby defining a plurality of pressure chambers coupled to an ink supply unit; and forming a plurality of nozzles in one end of each pressure chamber, respectively.

Accordingly, a piezoelectric member stuck on a single low-rigidity member can be divided into plural shapes. Therefore, inexpensive and short piezoelectric members can be used. It is also possible to form pressure chambers each partitioned into a shear-deformed piezoelectric member and a simple low-rigidity member. Therefore, the thickness of each piezoelectric member can be rendered thin and the cost of the piezoelectric member can be further reduced. In addition, the recessing can be applied to the low-rigidity member and each piezoelectric member stuck on the low-rigidity member in a stable state. Thus, a plurality of piezoelectric members can be brought into the same state as when they are shaped in integral form, without changing the shapes of the joints between the adjacent piezoelectric members. Further, grooves are defined in the joints between the adjacent piezoelectric members by grinding. The bottoms of the pressure chambers are formed by the single low-rigidity member, whereas the top surfaces thereof are formed by a single roof. Both sides of each pressure chamber are formed by posts each comprising the low-rigidity member and the piezoelectric member both of which have stuck to each other. It is, therefore, possible to reliably prevent ink from leaking out of each pressure chamber. Further, since the low-rigidity member has rigidity lower than that of the piezoelectric member, the resistivity of each post on the low-rigidity member side to each post on the piezoelectric member side can be reduced, thereby making it possible to increase the amount of strain of each post and improve the property of delivery of ink drops.

The above and other objects, features and advantages of the present invention will become apparent from the following description and the appended claims, taken in conjunction with the accompanying drawings in which preferred embodiments of the present invention are shown by way of illustrative example.

DETAILED DESCRIPTION OF THE PREFERRED EMBODIMENTS

One embodiment of the present invention as claimed in claims 1 and 2 will hereinafter be described with reference to FIGS. 1 through 5. As shown in FIG. 1(*a*), a low-rigidity member (substrate) 1 is first provided which has a non-conductive property and a non-electrostrictive property, and which facilitates the production of an elongate shape, can be mechanically processed, and is formed of a material having rigidity lower than that of each of piezoelectric members 2 as in the case of liquid-crystal polymeric plastic, for example. A plurality of piezoelectric members 2, which are provided adjacent to one another, are stuck on the surface of the low-rigidity member 1. In addition, each piezoelectric member 2 is formed of a piezoelectric ceramic and polarized in its thickness direction.

Figure 1A:
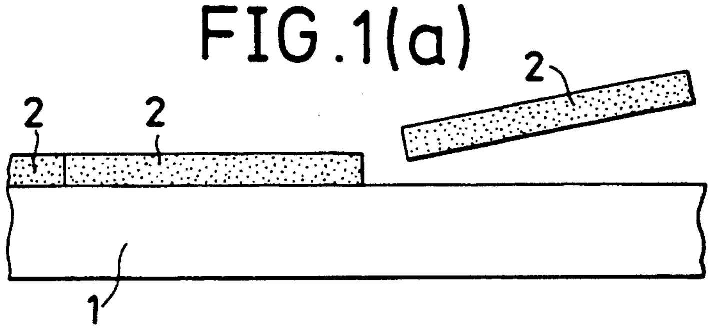
FIGS. 1(*a*)-1(*d*) are front views showing one embodiment of the present invention as claimed and showing a process for production of the above embodiment.
Figure 1B:
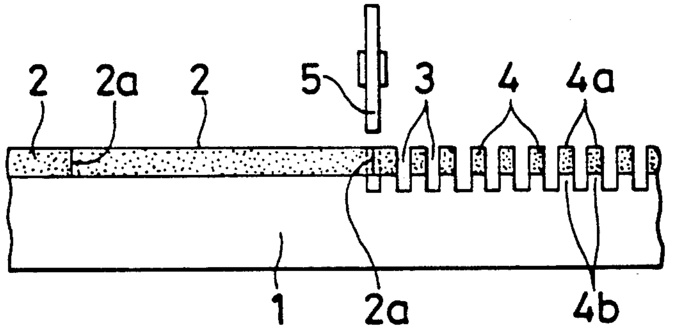
Figure 1C:
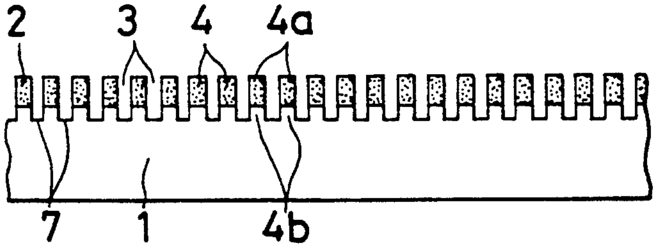
Figure 1D:
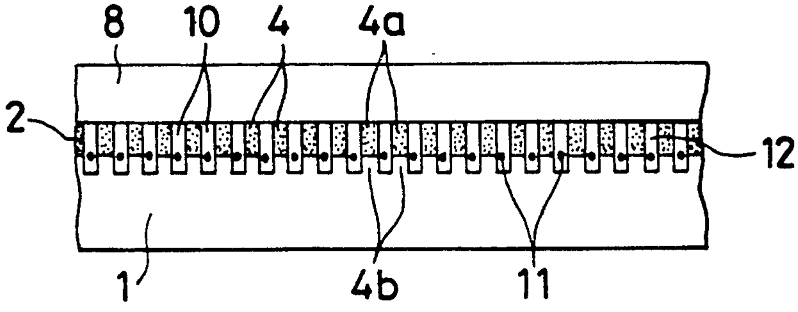
Figure 2:
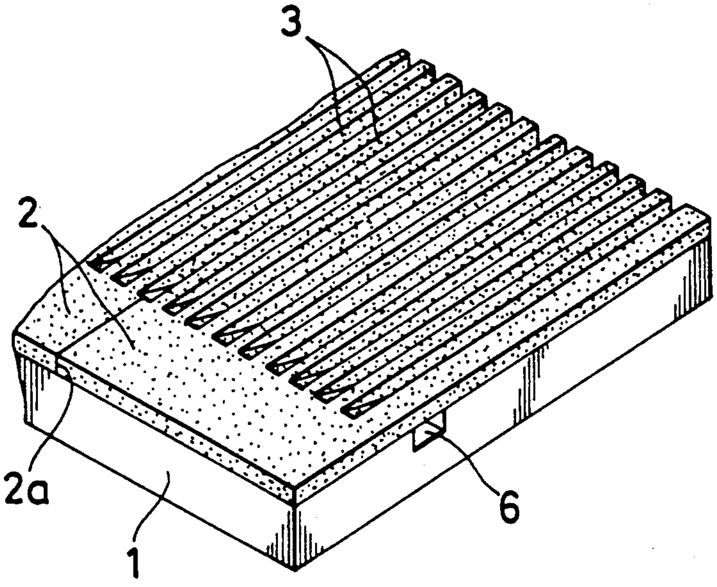
FIG. 2 is a perspective view showing one step of the production process.
Figure 3:
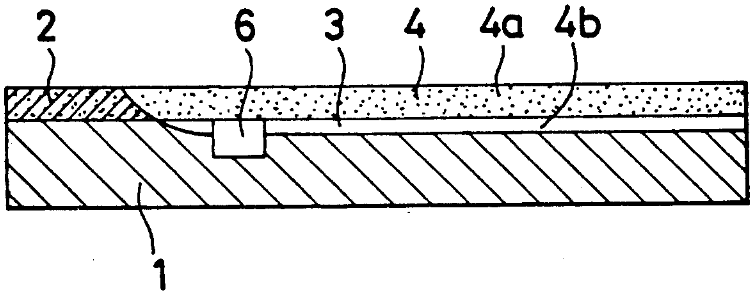
FIG. 3 is a vertical sectional side view illustrating the one step of the production process.

As shown in FIGS. 1(*b*), 2 and 3, a plurality of grooves 3 and a plurality of columns or posts 4 are formed in the low-rigidity member 1 and each piezoelectric member 2 in such a manner as to be alternately arranged. At this time, the intervals of the respective grooves 3 to be arranged and the widths of the piezoelectric members 2 are determined in such a way that each of specific grooves 3 is positioned on a joint 2*a* between the adjacent piezoelectric members 2. Accordingly, these posts 4 comprise upper posts 4*a* formed in each piezoelectric member 2 and lower posts 4*b* formed integrally with the low-rigidity member 1. These grooves 3 are mechanically processed by a diamond wheel 5 of a dicing saw used to cut an IC wafer. In FIGS. 2 and 3, the respective grooves 3 are in communication with a passage 6 which extends at a right angle to the grooves 3. The passage 6 is formed of the low-rigidity member 1 before the respective piezoelectric members 2 are stuck on the low-rigidity member 1.

As shown in FIG. 1(*c*), electrodes 7 each having an inverted U-shaped cross section are formed in the respectively corresponding grooves 3. Thereafter, leads (not shown) are electrically connected to the electrodes 7. These electrodes 7 are formed by a means for forming a catalytic layer on the low-rigidity member 1 and each piezoelectric member 2 after they have been subjected to pre-processing prior to plating, subjecting them to either electroless nickel plating or electroless copper plating or electroless gold plating and removing a plated layer formed onto the surface of each piezoelectric member 2.

Figure 4:
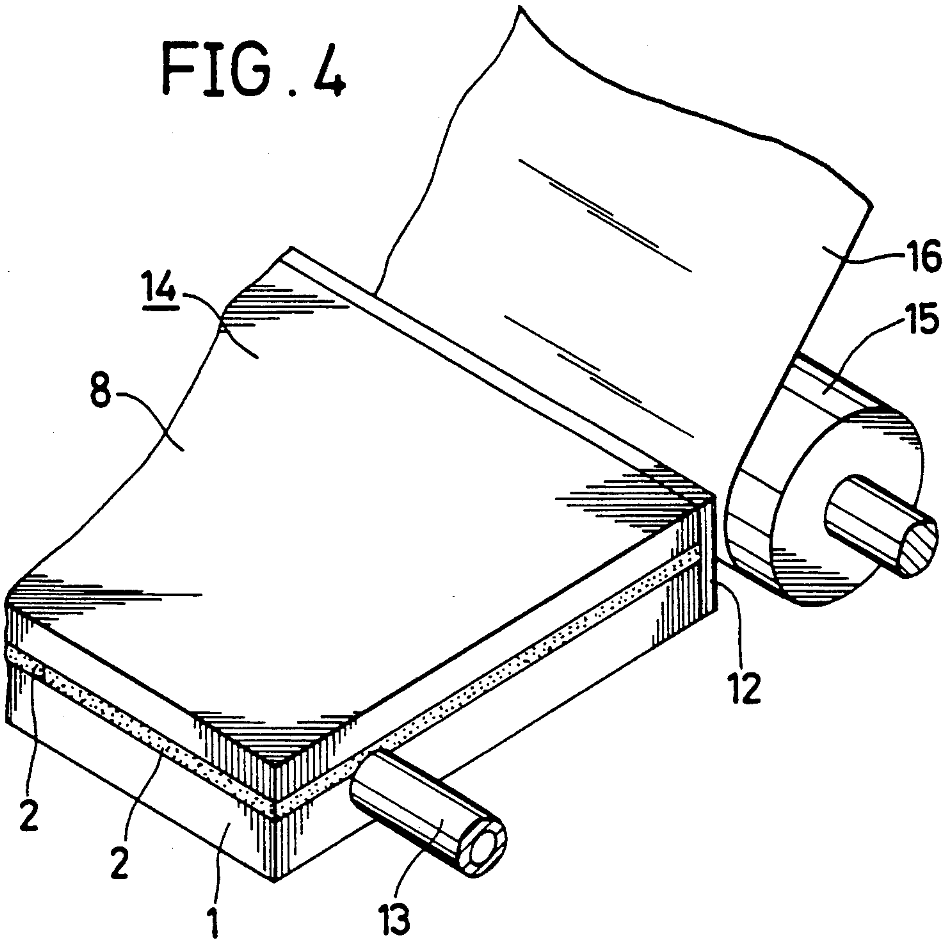
FIG. 4 is a perspective view showing the manner of completion of an ink-jet type printer head.

As shown in FIG. 1(*d*), a roof 8 is stuck on the surface of each piezoelectric member 2 so as to close or block an opening surface or area of each groove 3, thereby defining a plurality of pressure chambers 10. Further, nozzle plates 12 having a plurality of nozzles 11 are stuck onto corresponding end faces of the low-rigidity member 1 and the piezoelectric member 2. As illustrated in FIG. 4, an ink-jet type printer head 14 is formed by connecting an ink supply pipe 13 to the passage 6. Designated at numeral 15 is a platen on which a roll of sheet 16 is wound.

Figure 5:
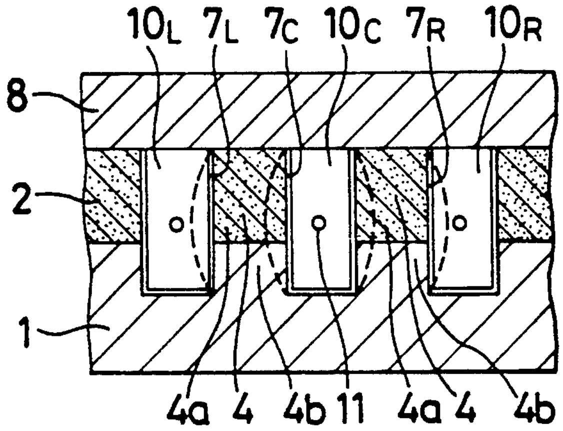
FIG. 5 is a vertical sectional front view showing variations in strain of each post employed in the printer head.

A description will now be made to the case where ink is delivered from a centrally-defined pressure chamber 10 under the construction referred to above with reference to FIG. 5. Now, the centrally-defined pressure chamber is indicated by 10*c*, and pressure chambers disposed on both sides as seen from the centrally-defined pressure chamber 10*c* are denoted by 10L, 10R respectively. A central electrode is indicated by 7*c*, and electrodes disposed on both sides as seen from the central electrode 7*c* are denoted by 7L, 7R respectively. When a negative voltage is applied to the electrode 7*c* formed onto the inner side face of the central pressure chamber 10*c* and a positive voltage is applied to each of the electrodes 7L, 7R, the posts 4 located on both sides of the central pressure chamber 7*c* are symmetrically deformed outward as indicated by the chain lines to thereby increase the capacity of the central pressure chamber 10*c* and to reduce its internal pressure. As a result, the ink in an ink supply unit is sucked into the central pressure chamber 10*c*. Then, when the application of the voltage to the above electrodes is stopped, the posts 4 serve to return to the original form owing to strain energy stored in the posts 4. Therefore, the capacity of the central pressure chamber 10*c* is reduced so that its internal pressure is raised. Thus, the ink of the central pressure chamber 10*c* is delivered from the nozzle 11.

At this time, each upper post 4a is formed of the piezoelectric member 2 having high rigidity, whereas each lower post 4b is formed of the low-rigidity member 1 which is made of a synthetic resin and has rigidity lower than that of the piezoelectric member 2. Therefore, the resistivity of each lower post 4b to the strain of each upper post 4a is reduced, thus increasing the amount of strain of each post 4 so as to enable the property of delivery of ink drops to be improved.

As described above, a piezoelectric member 2 stuck on a single low-rigidity member 1 can be divided into plural shapes. Therefore, an inexpensive and short piezoelectric member 2 can be used. It is also possible to form a pressure chamber 10 partitioned into a shear-deformed piezoelectric member 2 and a simple low-rigidity member 1. Therefore, the thickness of each piezoelectric member 2 can be rendered thin and the cost of each piezoelectric member 2 can be further reduced. In addition, the recessing can be applied to the low-rigidity member 1 and each piezoelectric member 2 stuck to the low-rigidity member 1 in a stable state. Thus, a plurality of piezoelectric members 2 can be brought into the same state as when they are shaped in an integral manner, without changing the shape of the joint 2a between the piezoelectric members 2. Further, each of the grooves 3 is defined in the joint 2a between the adjacent piezoelectric members 2 by grinding. The bottoms of the pressure chambers 10 are formed by the single low-rigidity member 1, whereas the top surfaces thereof are formed of the single roof 8. Both sides of the pressure chamber 10 are formed of the posts 4 each comprising the low-rigidity member 1 and the piezoelectric member 2, both of which have stuck to each other. It is, therefore, possible to reliably prevent the ink from leaking out of the pressure chamber 10.

Figure 6:
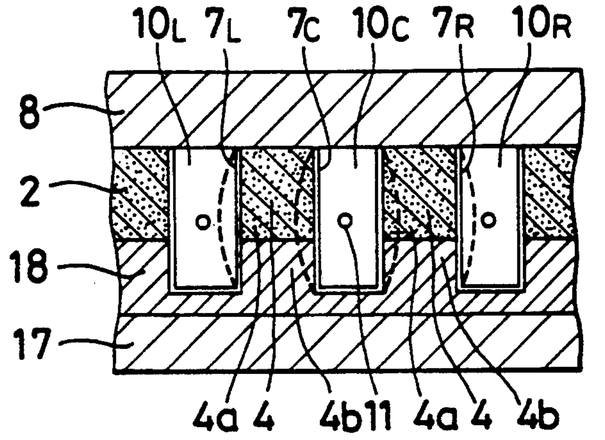
FIG. 6 is a vertical sectional side view depicting one embodiment of the present invention as claimed in claim 3.
Figure 7:
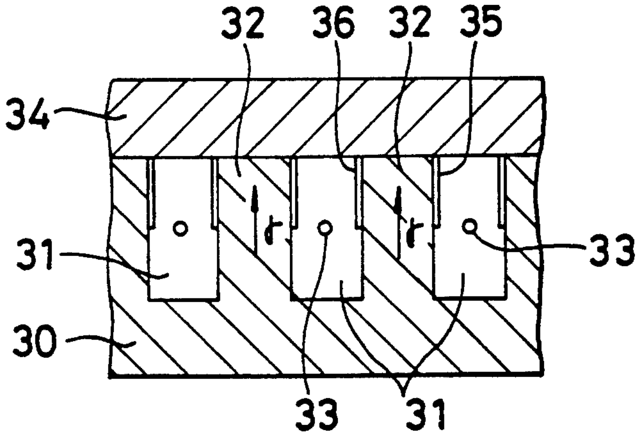
FIG. 7 is a vertical sectional front view illustrating a conventional example.
Figure 8:
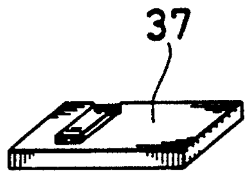
FIG. 8 is a perspective view illustrating one step of a conventional production process.
Figure 9:
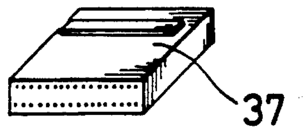
FIG. 9 is a perspective view showing one step of the conventional production process.
Figure 10:
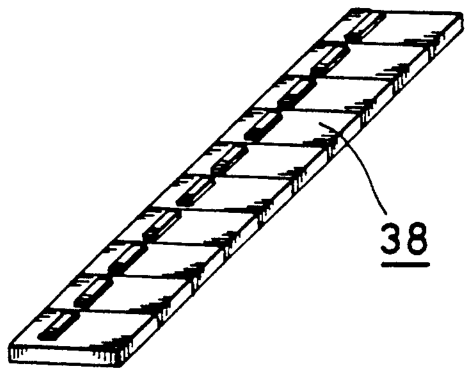
FIG. 10 is a perspective view showing a conventional ink-jet type printer head.
Figure 11:
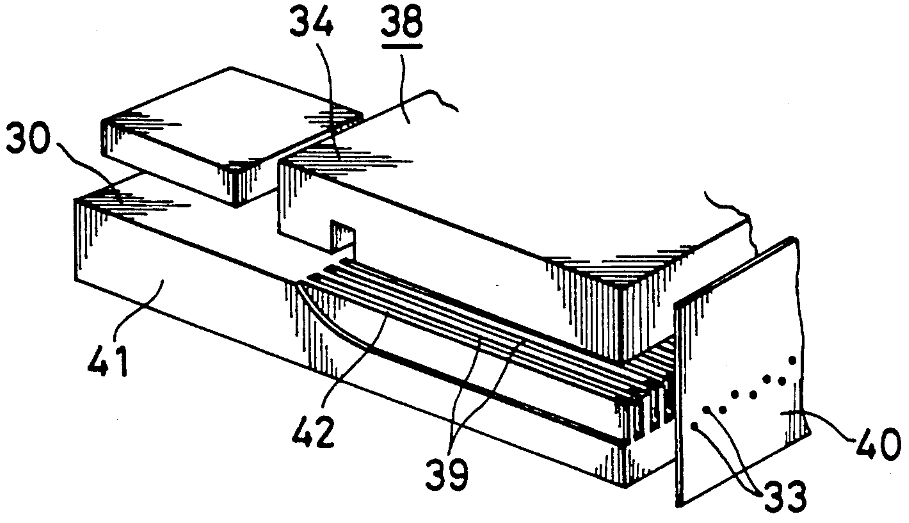
FIG. 11 is an exploded perspective view showing a part of the printer head illustrated in FIG. 10.

One embodiment of the invention as claimed in claim 3 will now be described with reference to FIG. 6. The same elements of structure as those employed in the aforementioned embodiment are identified by like reference numerals and their description will therefore be omitted. In the present embodiment, an adhesive layer for causing a substrate 17 and a piezoelectric member 2 to stick to each other is used as a low-rigidity member 18. A plurality of grooves are defined so as to extend from the surface of the piezoelectric member 2 to the inside of the low-rigidity member 18. Further, a plurality of pressure chambers 10 are defined by joining a roof 8 to the surface of the piezoelectric member 2. In the present embodiment as well, each of posts 4 disposed on both sides of the pressure chamber 10 comprises an upper post 4a of the piezoelectric member 2 and a lower post 4b of the low-rigidity member 18. Therefore, the amount of deformation of each post 4 can be increased in the same manner as the previous embodiment.

Since the adhesive layer for joining the substrate 17 and the piezoelectric member 2 to each other is used as the low-rigidity member 18 as described above, it is unnecessary to make the substrate 17 non-conductive. When the plating for forming electrodes 7 in the low-rigidity member 18 as the adhesive layer is made, the adhesive layer is mixed with a metal such as palladium or the like, which serves as a catalytic nucleus, thereby making it possible to apply the electroless plating to the low-rigidity member 18.

According to the present invention, a plurality of plate-shaped piezoelectric members polarized in their thickness directions are stuck, adjacent to one another, on the surface of a single low-rigidity member having a non-conductive property and a non-electrostrictive property. A plurality of grooves are defined in parallel at given intervals by grinding so as to extend from the surface of each of the piezoelectric members to the inside of the low-rigidity member, inclusive of positions at which the grooves extend through joints among the piezoelectric members. In addition, posts are formed on both sides of each of the grooves and electrodes are disposed on both inner sides of each groove. Then, a roof is stuck on the surface of each piezoelectric member to block or close the top opening area of each groove, thereby defining a plurality of pressure chambers coupled to an ink supply unit and each having one end at which a nozzle is provided. Therefore, the piezoelectric member stuck on the single low-rigidity member can be divided into plural shapes, thereby making it possible to use inexpensive and short piezoelectric members. It is also possible to form a pressure chamber partitioned into a shear-deformed piezoelectric member and a simple low-rigidity member. Therefore, the thickness of each piezoelectric member can be decreased and the manufacturing cost of the piezoelectric member can be reduced. Further, the recessing can be applied to the low-rigidity member and each piezoelectric member stuck to the low-rigidity member in a stable state. Thus, a plurality of piezoelectric members can be brought into the same state as when they are shaped in integral form, without changing the configurations of the joints among the piezoelectric members. Furthermore, the grooves are respectively defined in the joints among the piezoelectric members disposed adjacent to one another by grinding The bottoms of the pressure chambers are formed by the single low-rigidity member, whereas the top surfaces thereof are formed by the single roof. Both sides of the pressure chamber are formed by the posts each comprising the low-rigidity member and the piezoelectric member, both of which have stuck to each other. It is, therefore, possible to reliably prevent the ink from leaking out of each pressure chamber. Since the low-rigidity member has rigidity lower than that of the piezoelectric member, the resistivity of each post on the low-rigidity member side to the strain of each post on the piezoelectric member side can be reduced, thereby increasing the amount of strain of each post so as to enable the property of delivery of ink drops to be improved.

Having now fully described the invention, it will be apparent to those skilled in the art that many changes and modifications can be made without departing from the spirit or scope of the invention as set forth herein.

What is claimed is:

1. A method of fabricating an ink-jet type printer head, comprising the steps of:

sticking a plurality of plate-shaped piezoelectric members polarized in their thickness directions on the surface of a low-rigidity member having a non-conductive property and a non-electrostrictive property so that said piezoelectric members are disposed adjacent to said low-rigidity member;

defining a plurality of grooves extending from the surfaces of said piezoelectric members to the inside of said low-rigidity member by grinding in parallel at given intervals inclusive of positions at which said grooves extend through respective joints between said adjacent piezoelectric members;

forming posts on both sides of each of said grooves;

forming electrodes on two inner sides of each of said grooves;

sticking a roof on the surfaces of said piezoelectric members so as to close top opening surfaces of said grooves, thereby defining a plurality of pressure chambers coupled to an ink supply unit; and forming a plurality of nozzles in one end of each of said pressure chambers, respectively.

2. A method according to claim 1, wherein said low-rigidity member is a substrate formed of plastic.

3. A method according to claim 1, wherein said low-rigidity member is an adhesive layer for sticking each of said piezoelectric members and said substrate to each other.

* * * * *